United States Patent [19]

Lee

[11] Patent Number: 5,151,304
[45] Date of Patent: Sep. 29, 1992

[54] STRUCTURE AND METHOD FOR ENHANCING ADHESION TO A POLYIMIDE SURFACE

[75] Inventor: Kang-Wook Lee, Yorktown Heights, N.Y.

[73] Assignee: International Business Machines Corporation, Armonk, N.Y.

[21] Appl. No.: 644,063

[22] Filed: Jan. 22, 1991

[51] Int. Cl.⁵ .................. B05D 3/10; C23C 14/00; C23C 14/02
[52] U.S. Cl. .................. 427/250; 427/304; 427/305; 427/306; 427/316; 427/322; 204/192.1
[58] Field of Search .......... 427/306, 316, 307, 304, 427/309, 250, 305, 322; 204/192.1

[56] References Cited

U.S. PATENT DOCUMENTS

| | | | |
|---|---|---|---|
| 3,445,264 | 5/1969 | Haines | 427/129 |
| 3,881,049 | 4/1975 | Brant et al. | 428/458 |
| 4,386,116 | 5/1983 | Nair et al. | 427/99 |
| 4,517,254 | 4/1985 | Grapentin et al. | 428/626 |
| 4,528,245 | 7/1985 | Jobbins | 428/457 |
| 4,720,401 | 1/1988 | Ho et al. | 427/250 |
| 4,755,555 | 7/1988 | Manwiller et al. | 524/607 |
| 4,803,097 | 2/1989 | Fraenkel et al. | 427/307 |
| 4,822,451 | 4/1989 | Ouderkirk et al. | 156/643 |
| 4,824,699 | 4/1989 | Woo et al. | 427/307 |
| 4,832,799 | 5/1989 | Knudsen et al. | 204/22 |
| 4,861,663 | 8/1989 | Sirinyan et al. | 428/409 |
| 4,931,310 | 6/1990 | Anschel et al. | 427/55 |
| 5,019,210 | 5/1991 | Chou et al. | 156/643 |

OTHER PUBLICATIONS

Bunshah, R. F. Deposition Technologies for Films and Coatings Noyes Publication, 1982, p. 258.

Primary Examiner—Michael Lusignan
Assistant Examiner—Bret Chen
Attorney, Agent, or Firm—Browdy and Neimark

[57] ABSTRACT

The surface of a substrate made of substantially crystalline polyimide is converted to form a layer of substantially amorphous polyimide. The substantially amorphous layer is formed by treating the crystalline polimide surface with a base followed by treatment with an acid to form a polyamic acid layer, which is reimidized to form a substantially amorphous layer by a low temperature heat cycle. Metals or polyimides can be deposited onto this amorphous layer, which is then cured to convert the amorphous layer to substantially crystalline polyimide. This process enhances the adhesion of the metal or polyimide layer without introducing contamination (new foreign materials or new functional groups) from surface treatments of adhesion layers.

14 Claims, 1 Drawing Sheet

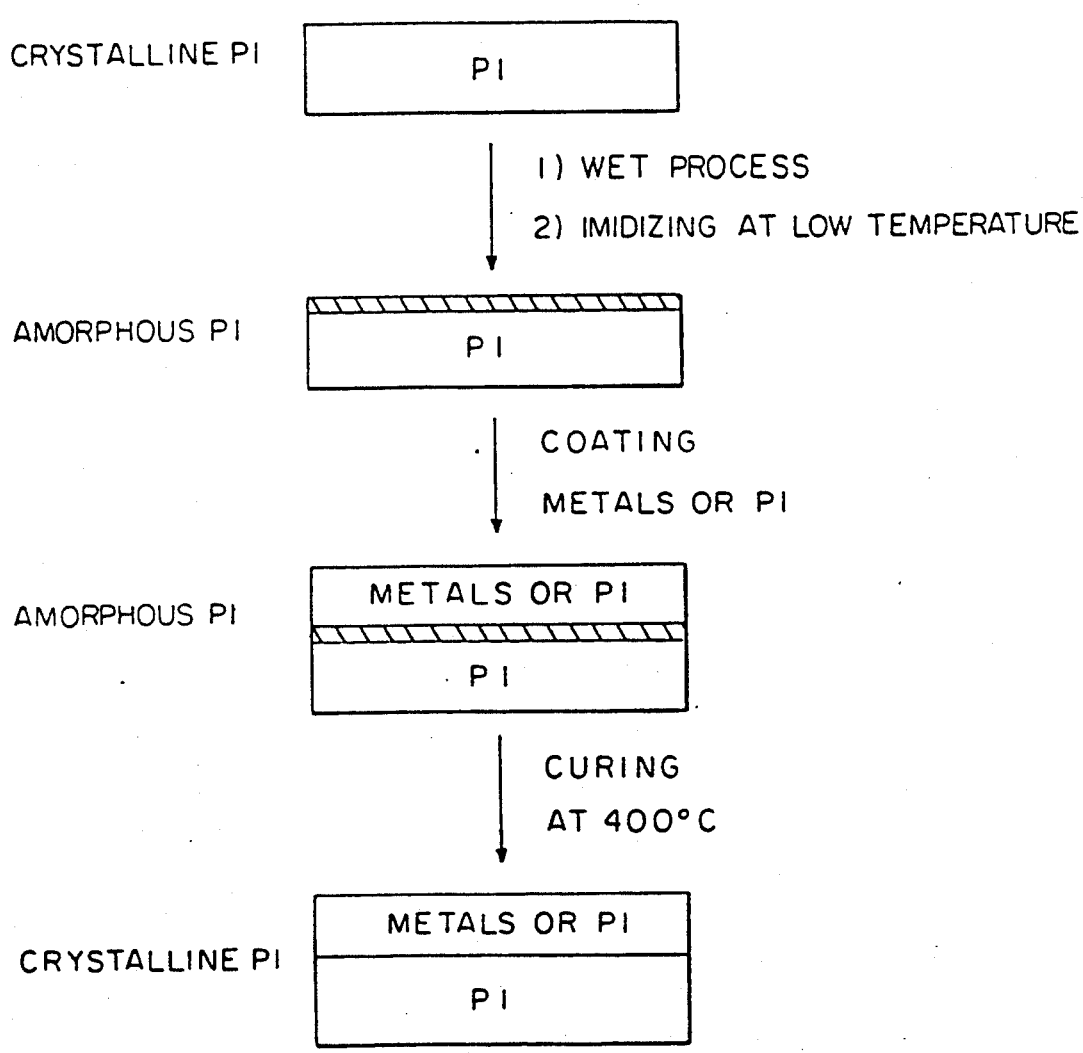

STRUCTURE AND METHOD FOR ENHANCING ADHESION TO A POLYIMIDE SURFACE

FIELD OF THE INVENTION

The present invention relates to a method for forming an amorphous surface on polyimide.

BACKGROUND OF THE INVENTION

Polyimides are used as dielectric layers in a variety of microelectronic applications, as they have good processability, low dielectric constant, high thermal stability, low moisture absorption, and good mechanical properties. Metal patterns are disposed on polyimide surfaces to form electrically conducting lines on chips and chip packages.

For example, in the formation of multilayer substrates for mounting chips, one configuration uses an insulating substrate of a ceramic material onto which is deposited a pattern of metallic conductors. Conventionally, the conductors are three layers of metal, including a layer of chromium, a layer of copper, and an overlying layer of chromium. A layer or film or a polyimide is placed on top of the metallized ceramic substrate, and a second layer of a pattern of conductors is placed on top of the metallized ceramic substrate. The metal contacting the polyimide on the second or subsequent layer can be copper, as disclosed in Nair et al. U.S. Pat. No. 4,386,116, assigned to International Business Machine Corporation, the entire disclosure of which is incorporated herein by reference.

However, direct adhesion of metals or polyimides to polyimide is weak. Failure to activate a polymeric surface will normally cause subsequent coatings to be poorly adhered and easily cracked, blistered, or otherwise removed. Surface treatments and adhesion layers have been used to enhance the adhesion of metal or polyimide layers to polyimides. These methods can introduce contamination, resulting in reliability failures. Modifying the polyimide chemically by introducing new foreign materials or new functional groups may cause reliability problems as well.

A number of methods have been used to improve adhesion of metals to polyimide surfaces. For example, Haines, in U.S. Pat. No. 3,445,264, discloses that the surfaces of polyimide articles can be treated to activate the surfaces and render them more adherent toward coating compositions by exposing the surface of the polymeric article to an activating solution consisting of alkaline metals, alkaline earth metals, hydrides, or amides of alkaline metals or alkaline earth metals in a dialkyl sulfoxide solvent vehicle.

Brandt et al., in U.S. Pat. No. 3,881,049, disclose that copper can be deposited onto a surface of a polyimide article by treating the polyimide surface with a solution of a noble metal salt and a halogenated alkanoic acid, and then drying the surface at an elevated temperature. The surface is then treated with a solution including a reducing agent, after which the surface is treated with a solution containing a copper salt and a reducing agent.

Grapentin et al, in U.S. Pat. No. 4,517,254, disclose a process for adhesive metallization of polyimide by pretreating the polyimide and subsequently activating the polyimide. The polyimide is pretreated with an aqueous solution of alkali hydroxide and an organic nitrogen compound such as N,N,N',N'-tetra-(2-hydroxypropyl)-ethylenediamine, ethylenediaminetetraacetic acid, and nitrilotriacetic acid.

Jobbins, in U.S. Pat. No. 4,528,245, discloses a process for conditioning the surfaces of polyimides and other polymers by exposing the surfaces to an atmosphere comprising ozone, contacting the surfaces with a conditioning solvent, and washing the surfaces with an aqueous solution of at least one surfactant. These polymers can then be electrolessly plated.

Manwiller et al., in U.S. Pat. No. 4,755,555, disclose a particulate polyimide molding resin which has a high surface area and low crystallinity. These polyimides are formed by reacting at least one organic diamine with at least one tetracarboxylic acid dianhydride to form a polyamide acid. This polyamide acid is then precipitated from solution and subsequently converted to a polyimide by heating. By carefully controlling the reaction parameters, a polyimide having high surface area and low degree of crystallinity is produced. These polyimides are particularly tough.

Fraenkel et al., in U.S. Pat. No. 4,803,097, disclose a process for conditioning the surfaces of plastic materials such as polyimides in order to facilitate electroless plating of the plastics. The surfaces of the plastic article are exposed to an ozone atmosphere, and then contacted with a conditioning solvent such as at least one alcohol and at least one strong base, and then contacted with an oxidizing agent. The surface is then ready for electroless deposit of a metal coating thereon.

Ouderkirk et al., in U.S. Pat. No. 4,822,451, disclose a method of rendering surfaces of semicrystalline polymers quasiamorphous by irradiation. This enhances the surfaces' ability to bond to other materials. The surface of these quasi-crystalline polymers can be amorphized by exposure to an intense short pulse UV excimer laser or short pulse duration, high intensity UV flashlamp. This procedure is useful primarily for polyethylene terephthalate, although it can be used for UV absorbing polymers such as nylon, other polyesters, poly(vinylchloride) with UV absorbing plasticizer.

Woo et al., in U.S. Pat. No. 4,824,699, disclose that coatings can be adhered directly to semicrystalline polymer films by first rendering the surface of the film quasi-amorphous, washing the surface with a solvent for amorphous polyester and coating the surface, or coating and heating the surface to a temperature to recrystallize the surface of the polymer. This process is particularly useful for polyethylene terephthalate.

Sirinyan et al., in U.S. Pat. No. 4,861,663, disclose that polyimides can be pretreated for subsequent surface coating by treating the polyimide surface with a solution of a mixture of salts comprising (a) halides of group I or II metals, particularly calcium chloride, magnesium chloride, lithium chloride, sodium chloride and/or potassium chloride; (b) salts of weak organic bases with strong inorganic acids, particularly aluminum chloride, ferric chloride, titanium tetrachloride, antimony pentachloride, calcium chloride, ferrous chloride, cupric chloride, zinc chloride and/or molybdenum chloride and/or the chelate complexes of these salts with Schiff bases, amines, carboxylic acids, diketones, $\alpha,\beta$-unsaturated ketones and phosphines; (c) in a non-corrosive, I5 organic swelling agent or solvent for the materials mentioned, where appropriate. With the addition of water, preferably in an alcohol, at temperatures up to the boiling point of the solvent, the molded articles are washed with water or other solvent and are then dried.

Anschel et al. in U.S. Pat. No. 4,931,310, disclose a method for treating the surface of polyimides to improve the properties of the polyimides. The surface of the polyimide is first treated with a base to convert the surface layer of the polyimide to polyamic acid, and the surface layer of the converted polyamic salt formed on the surface is treated with an acid to convert the layer of a polyamic acid, followed by a cure to prevent the formation of any significant amounts of transimide. The metal is then applied to the surface layer.

The major disadvantage of the above processes for treating polyimides is that adhesion layers or chemicals remain on the polyimide surface after pretreatment thereof.

It is yet another object of the present invention to provide a polyimide layer coated onto at least part of the surface of a crystalline polyimide body.

SUMMARY OF THE INVENTION

It is an object of the present invention to overcome deficiencies in the prior art.

It is another object of the present invention to provide a crystalline polymer having an amorphous layer on at least a part of the surface to the polymeric body.

It is a further object of the present invention to provide an electrically conducting layer on at least a part of the amorphous surface of a crystalline polymer.

It is still another object of the present invention to provide an electrically conducting coating on a crystalline polymeric substrate, and then cure the amorphous layer to a crystalline layer.

It is yet another object of the present invention to provide a polyimide layer coated onto at least part of the surface of a polyimide body.

Polymers generally can be either semicrystalline or amorphous. These categories are used to describe the degree of ordering of the polymer molecules. Amorphous polymers consist of randomly ordered tangled chains, i.e., amorphous polymers are highly disordered and intertwined with other molecules. Semicrystalline polymers consist of a mixture of amorphous regions and crystalline regions. The crystalline regions are more ordered and segments of the chains actually pack in crystalline lattices. Some crystalline regions may be more ordered than others. If crystalline regions are heated above the melting temperature of the polymer, the molecules become less ordered or more random. If cooled rapidly, this less ordered feature is "frozen" in place and the resulting polymer is said to be amorphous. If cooled slowly, these molecules can repack to form crystalline regions, and the polymer is said to be semicrystalline.

Crystalline polyimide consists of some amorphous polyimide and amorphous polyimide may contain a small amount of crystalline polyimide. However, the properties of the two materials are very different. According to the present invention, the morphology of the polyimide surface is changed from a more crystalline state to a more amorphous state. Metals or polyimide precursors are coated onto the amorphous polyimide surface, and the surface is then cured by heating at approximately 400.C to convert the amorphous polyimide to the more crystalline polyimide. No foreign materials are introduced into the interfaces between the polyimide surface and the coating material.

Thus, according to the present invention, metal-to-polyimide and polyimide-to-polyimide adhesion is enhanced by converting a crystalline polyimide surface to an amorphous polyimide surface. The intermediate state is then converted to the final crystalline state of the polyimide. This method avoids problems of reliability of the surfaces coated onto the polyimide.

More specifically, a crystalline polyimide is treated with a suitable base, for example, by immersing the polyimide in the base solution or spraying the base solution onto the polyimide-coated substrate. The polyimide is then washed with water and treated with an acid, again, for example, by immersion or spraying. This forms a polyamic acid surface, which is subsequently imidized by heating to about 150-250° C. to form an amorphous polyimide. This polyimide surface is very receptive to coatings of metals or other polyimides. After the amorphous polyimide surface has been coated, the polyimide is cured, generally by heating to a temperature of about 350–450° C., to recrystallize the polyimide.

BRIEF DESCRIPTION OF THE DRAWING

The figure shows the method of the present invention in pretreating crystalline polyimide to subsequent metal or polyimide coating.

DETAILED DESCRIPTION OF THE INVENTION

The process of the present invention can be used to improve the adhesion of either metals or polyimide to crystalline polyimide surfaces. For the purpose of the present invention, a crystalline polyimide may contain some amorphous polyimide, although the polyimide has the characteristics of crystalline polyimide rather than amorphous polyimide.

The term polyimide as used in the present invention includes all conventional polyimides, which polymers are generally produced by reaction of carboxylic acid anhydrides with aromatic diamines. These compounds are extensively linear, highly heat-stable plastics of the general formula

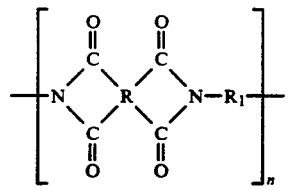

Where n is an integer representing the number of repeating units to provide a molecular weight usually about 10,000 to about 100,000. R is at least one tetravalent organic radical selected from the group consisting of:

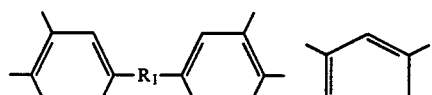

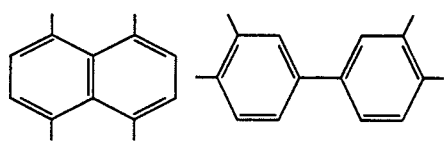

-continued

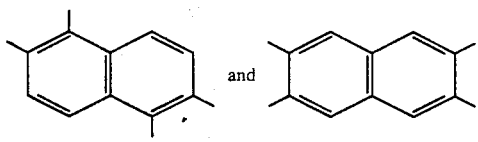 and $R_2$ is selected from the group consisting of divalent aliphatic hydrocarbon radicals having from 1 to 4 carbon atoms and carbonyl, oxy, sulfo, hexafluoroisopropylidene and sulfonyl radicals and in which $R_1$ is at least one divalent radical selected from the group consisting of:

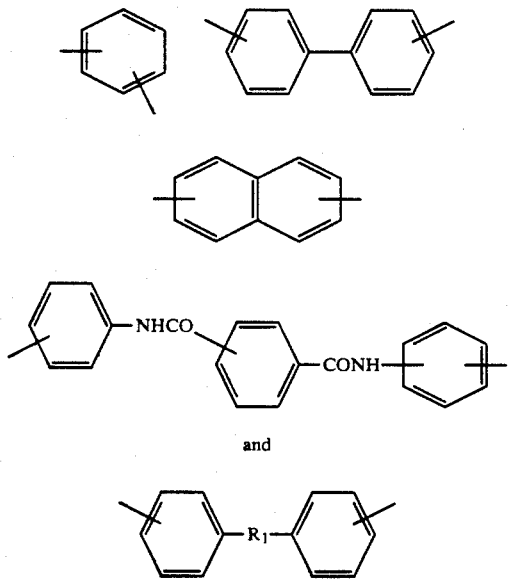

in which $R_3$ is a divalent organic radical selected from the group consisting of $R_2$, silicon, and amino radicals. Polymers containing two or more of the R and/or $R_1$ radicals, especially multiple series of $R_1$ containing amino radicals, can be used.

It should be understood that not only plastics of pure polyimide can be treated according to the process of the present invention, but also plastics which are coated on one side with other plastics.

Examples of such polyimides include polyimides formed by condensing carboxylic anhydrides with aromatic diamines such as 4,4'-diamino-diphenyl-propane; 4,4'-diamino-diphenylmethane, benzidine; 4,4'-diamino-diphenylsulfone; 4,4'-diamino-diphenylether; m-phenylene-diamine; and p-phenylene-diamine. Suitable acid anhydrides include the dianhydrides of 1,3,6,7-naphthalene tetracarboxylic acid; 3,3',4,4'-diphenyl tetracarboxylic acid; bis-(3,4-dicarboxyl-phenyl)-ether and pyromellitic acid.

The polyimides can be treated with aqueous solutions of any suitable base, either inorganic or organic bases. The concentration of the base is adjusted to provide optimum times for treatment; a lower concentration is required for a stronger base than for a weaker base to effect the desired treatment within a specific period of time. Among the bases that can be used for this treatment are potassium hydroxide, sodium hydroxide, ammonium hydroxide, tetramethyl ammonium hydroxide, amines and other organic bases. The concentration of the base in solution is generally from about 0.05M to about 5M.

After being washed with water, the polyimides are then treated with an aqueous solution of an acid. Suitable acids for use in this process include hydrochloric acid, acetic acid, sulfuric acid, nitric acid, and the like. As with the bases, the concentration of acid used may be varied, with the higher concentrations of stronger acid requiring less time for reaction than lower concentrations of weaker acids. In general, the concentration of acid used ranges from about 0.05M to about 2M.

EXAMPLE

Pyromellitic dianhydride-oxydianiline (PMDA-ODA) polyamic acid was cured at 400° C. to form a crystalline state polyimide. The polyimide surface was then converted to polyamic acid by a wet process in which an aqueous solution of a base and then of an acid were used. The polyamic surface so formed was then imidized at 150-250° C. to form an amorphous polyimide, as shown in the figure. If the polyamic acid is cured to a polyimide at a lower temperatures, about 200° C., the polyimide is in an amorphous state. The external reflectance infrared (ERIR) spectra provided the direct evidence for imidization.

Crystalline polyimide, cured at 400° C.:
ERIR 1778 (w), 1726 (w,sh), 1598 (vw), 1512 (m,sh), 1502 (s), 1381 (m,br), 1247 (vs)cm$^{-1}$.

Polyamic acid:
ERIR 1727 (s), 1668 (s), 1540 (m), 1512 (m,sh), 1502 (s), 1414 (m), 1246 (vs)cm$^{-1}$.

Amorphous polyimide, cured at 150-250° C.:
ERIR 1778 (w), 1740 (vs), 1726 (vw,sh), 1512 (m,sh), 1502 (s), 1381 (m,br), 1247 (vs) cm$^{-1}$ The spectrum of crystalline poly(pyromellitic dianhydride-oxydianiline) (PMDA-ODA), cured at 400° C., is almost the same as that of amorphous PMDA-ODA, cured at the relatively low temperature of 250° C. which does not contain the bands corresponding to polyamic acid, indicating that the surface is fully imidized to the amorphous polyimide.

Metal-to Polyimide Adhesion

As shown in the figure, chromium (500 Å) was sputter (or evaporater)-coated to the amorphous polyimide surface, followed by coating with 2 $\mu$m copper. Additional copper, 10 $\mu$m, was electroplated to measure the peel strengths. The 90° peel strength was measured by peeling the metal Cr/Cu layer from the polyimide substrate. The peel strength was increased from 2-3 g/mm (control) to 45 g/mm.

Polyimide-to-Polyimide Adhesion

PMDA-ODA polyamic acid was spin-coated onto the amorphous polyimide surface prepared as in Example 1, and then the whole layer was cured at 400° C. The 90° peel strength was measured by peeling the 20-$\mu$m thick polyimide coating layer. The peel strength was enhanced from 3 g/mm (control) to 90-120 g/mm.

BPDA-PDA polyamic acid was spin-coated onto the amorphous PMDA-ODA polyimide prepared as in Example 1, and then the whole layer was cured at 400° C. The 90° peel strength was enhanced from 3 g/mm (control) to 90 g/mm.

PMDA-ODA polyamic ester was spin-coated onto the amorphous polyimide prepared as in Example 1, and then the whole layer was cured at 400° C. The 90° peel strength was enhanced from 5 g/mm (control) to 85 g/mm.

A photosensitive polyimide (Asahi G62461 or Toray UR3840) was spin-coated onto the amorphous polyimide prepared as in Example 1, and then exposed and developed The whole layer was cured at 400° C. The 90° peel strength was enhanced from 5 g/mm (control) to 63 g/mm.

The amorphous polyimide surface prepared according to the present invention can be used as an adhesive layer in the metal-to-polyimide and polyimide-to-polyimide lamination for parallel processing. Lamination of polyimide onto amorphous polyimide (entire layer) gave good adhesion.

The polyimide coated according to the present invention can be used in a great variety of packaging structures. Examples of these structures include the following:

(1) Multichip-module thin film packaging
(2) BEOL silicon structure
(3) Parallel processing of thin film circuitry
(4) Tape automated bonding The process of the present invention provides many advantages over the prior art process, including high throughput, low cost, no problems with reliability, no effect on the bulk properties of the polyimide, and no interface in the polyimide-to-polyimide adhesion.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation.

Having thus described our invention, what we claim as new, and desire to secure by Letters Patent, is:

1. A process for forming a layer of substantially amorphous polyimide on at least part of the surface of a substantially crystalline polyimide article for subsequent coating of said article followed by recrystallizing said amorphous polyimide comprising:
   treating at least a part of the surface of said substantially crystalline polyimide article with a base;
   washing said base treated surface;
   treating at least part of the surface of said substantially crystalline polyimide article with an acid to convert said treated substantially crystalline polyimide to polyamic acid;
   heating said acid treated article to imidize said polyamic acid, thereby forming on said at least part of the surface a layer of amorphous polyimide.

2. The process according to claim 1 wherein said base is selected from the group consisting of sodium hydroxide, potassium hydroxide, ammonium hydroxide, and tetramethyl ammonium hydroxide.

3. The process according to claim 2 wherein the base is an aqueous solution of from about 0.05M to about 5M base.

4. The process according to claim 1 wherein said acid is selected from the group consisting of hydrochloric acid, acetic acid, sulfuric acid, and nitric acid.

5. The process according to claim 4 wherein said acid is an aqueous solution of from about 0.05 to about 2M acid.

6. A process for improving the adhesion of metals to the surface of a substantially crystalline polyimide article comprising:
   treating at least a part of the surface of said substantially crystalline polyimide article with a base;
   washing said base treated surface;
   treating at least part of the surface of said substantially crystalline polyimide article with an acid to convert said treated substantially crystalline polyimide to polyamic acid;
   heating said acid treated article to imidize said polyamic acid, thereby forming on said at least part of the surface a layer of amorphous polyimide;
   coating said layer of amorphous polyimide with a metal; and
   curing said article to convert said substantially amorphous polyimide to substantially crystalline polyimide.

7. The process according to claim 6 wherein said base is selected from the group consisting of sodium hydroxide, potassium hydroxide, ammonium hydroxide, and tetramethyl ammonium hydroxide.

8. The process according to claim 6 wherein said acid is selected from the group consisting of hydrochloric acid, acetic acid, sulfuric acid, and nitric acid.

9. The process according to claim 6 wherein said metal is a composite layer of copper, chromium, cobalt, nickel and other transition metals.

10. The process according to claim 9 wherein said metal is sputter coated onto said amorphous polyimide surface.

11. The process according to claim 9 wherein said metal is evaporator coated onto said amorphous polyimide.

12. A process for improving the adhesion of polyimides to the surface of a substantially crystalline polyimide article comprising:
   treating at least a part of the surface of said substantially crystalline polyimide article with a base;
   washing said base treated surface;
   treating at least part of the surface of said substantially crystalline polyimide article with an acid to convert said treated substantially crystalline polyimide to polyamic acid;
   heating said acid treated article to imidize said polyamic acid, thereby forming on said at least part of the surface a layer of amorphous polyimide;
   coating said layer of amorphous polyimide with a polyimide; and
   curing said article to convert said substantially amorphous polyimide to substantially crystalline polyimide.

13. The process according to claim 12 wherein said base is selected from the group consisting of sodium hydroxide, potassium hydroxide, ammonium hydroxide and tetramethyl ammonium hydroxide.

14. The process according to claim 12 wherein said acid is selected from the group consisting of hydrochloric acid, acetic acid, sulfuric acid, and nitric acid.

* * * * *